United States Patent
Tsai et al.

(10) Patent No.: US 7,945,342 B2
(45) Date of Patent: May 17, 2011

(54) AUDIO PROCESSING APPARATUS FOR AUTOMATIC GAIN CONTROL

(75) Inventors: Wen-Sheng Tsai, Guangdong (CN); Xiao-Guang Li, Guangdong (CN); Rong-Hwa Ding, Guangdong (CN); Kuan-Hong Hsieh, Guangdong (CN)

(73) Assignees: Hong Fu Jin Precision Industry (Shen Zhen) Co., Ltd., Shenzhen, Guangdong Province (CN); Hon Hai Precision Industry Co., Ltd, New Taipei (TW)

( * ) Notice: Subject to any disclaimer, the term of this patent is extended or adjusted under 35 U.S.C. 154(b) by 1170 days.

(21) Appl. No.: 11/619,601

(22) Filed: Jan. 3, 2007

(65) Prior Publication Data
US 2007/0255436 A1   Nov. 1, 2007

(30) Foreign Application Priority Data

Apr. 21, 2006  (CN) .......................... 2006 1 0060413

(51) Int. Cl.
 *G06F 17/00* (2006.01)
(52) U.S. Cl. .......................................... 700/94; 381/107
(58) Field of Classification Search .................... 381/56, 381/57, 104, 107, 109; 700/94
See application file for complete search history.

(56) References Cited

U.S. PATENT DOCUMENTS

| | | | |
|---|---|---|---|
| 4,944,686 A * | 7/1990 | Gertz | 439/175 |
| 6,859,538 B1 * | 2/2005 | Voltz | 381/77 |
| 2001/0020193 A1 * | 9/2001 | Teramachi et al. | 700/94 |
| 2005/0251273 A1 * | 11/2005 | Bychowsky et al. | 700/94 |

FOREIGN PATENT DOCUMENTS

CN    1554098 A    12/2004

\* cited by examiner

*Primary Examiner* — Walter F Briney, III
(74) *Attorney, Agent, or Firm* — Winston Hsu; Scott Margo

(57) ABSTRACT

The present invention provides an audio processing apparatus for automatically controlling gain. The audio processing apparatus includes an audio signal source and a sound reproduction device. The sound reproduction device attaches to the audio signal source, which includes a storage unit for storing a default gain value and a gain index table. The gain index table lists genre types with a genre gain value of each of the genre types. After receiving a play command signal, the audio signal source fetches an audio file to be played, reads a genre type of the audio file from a tag thereof, and processing the audio file to generate audio signals. The audio signal source further reads a genre gain value of the genre type from the gain index table, amplifies the audio signals by the genre gain value, and sends the amplified audio signals to the sound reproduction device to reproduce corresponding sounds.

10 Claims, 6 Drawing Sheets

AUDIO PROCESSING APPARATUS FOR AUTOMATIC GAIN CONTROL

CROSS REFERENCE TO RELATED APPLICATION

This application is related to commonly-assigned copending application entitled, "AUDIO PROCESSING SYSTEM WITH FUNCTION OF AUTOMATIC GAIN CONTROL AND METHOD THEREOF", filed on Nov. 8, 2006. Disclosure of the above identified application is incorporated herein by reference.

BACKGROUND OF THE INVENTION

1. Field of the Invention

The present invention relates to an audio processing apparatus for automatic gain control, especially to an audio processing apparatus for automatic gain control according to a genre type of an audio file to be played.

2. General Background

Studies have shown that an increased pace of life makes people more intense. Therefore, enjoying music becomes one of many relaxing activities for people. Apparently, enjoying music is seen everywhere, whether during work, commuting, or resting.

According to an international standard, each audio file includes a tag for storing metadata of the audio file. For example, an MP3 file has a tag, namely an ID3 tag that stores a title, artist(s), album, genre type, and other aspect of the MP3 file. In order that a listener may enjoy music most comfortably, audio signals of audio files need to be amplified by the gain amplifier with different gain values. However, audio players available in the market can't automatically adjust a default gain value of the gain amplifier. So the listener needs to manually adjust the default gain value of the gain amplifier, an annoying task that should be eliminated.

Therefore, a heretofore unaddressed need exists in the industry to overcome the aforementioned deficiencies and inadequacies.

SUMMARY OF THE INVENTION

The present invention provides an audio processing apparatus for automatic gain control. The audio processing apparatus automatically identifies genre type of an audio file to be played, reads a genre gain value of the genre type from an external storage unit, amplifies audio signals by the genre gain value, so that volume of sounds corresponding to the audio signals is proper to users' hearing.

The audio processing apparatus includes an audio signal source and a sound reproduction device. The audio signal source includes a first storage unit, a command input unit, a processing unit, a digital-to-analog converter, a gain amplifier and a bus port. The bus port connects to the sound reproduction device. The command input unit receives operational inputs and generates command signals. The command signals include a play command signal. The first storage unit stores a plurality of audio files and a decoding program. The processing unit includes a decoding unit for invoking the decoding program after receiving the play command signal, fetching a selected audio file from the audio files, and decoding the selected audio file thereby generating digital audio signals. The digital-to-analog converter converts the digital audio signals to analog audio signals. The gain amplifier amplifies the analog audio signals, and sends the analog audio signals to the sound reproduction device via the bus port. The sound reproduction device includes a port adapter, a sound reproduction unit, a second storage unit and data transmission lines. The port adapter attaches to the bus port. The sound reproduction unit receives the analog audio signals from the audio signal source via the port adapter, and reproducing sounds corresponding to the analog audio signals. The second storage unit stores a default gain value and a gain index table; the gain index table lists genre types with a genre gain value of each of the genre types. The data transmission lines transmit the genre types and the genre gain values between the second storage unit and the audio signal source via the port adapter. The processing unit of the audio signal source further includes a gain manager, which including a genre reading module, a gain reading module, a gain adjusting module and a gain update module. The genre reading module reads a genre type of the selected audio file from a tag of the selected audio file. The gain reading module reads a genre gain value of the genre type from the gain index table. The gain adjusting module signals the gain amplifier to amplify the analog audio signals received from the digital/analog converter by the genre gain value. The gain update module updates the default gain value with the genre gain value.

The audio processing apparatus includes an audio signal source and a sound reproduction device. The audio signal source includes a first storage unit, a command input unit, a processing unit, a digital-to-analog converter, a gain amplifier and a bus port. The bus port attaches to the sound reproduction device. The command input unit receives operational inputs and generates command signals. The command signals include a play command signal. The first storage unit stores a plurality of audio files and a decoding program. The processing unit includes a decoding module for invoking the decoding program after receiving the play command signal, fetching a selected audio file from the audio files, and decoding the selected audio file thereby generating digital audio signals. The digital-to-analog converter converts the digital audio signals to analog audio signals. The gain amplifier amplifies the analog audio signals, and sends the analog audio signals to the sound reproduction device via the bus port. The sound reproduction device includes a port adapter, a sound reproduction unit, a second storage unit and data transmission lines. The port adapter attaches to the bus port. The sound reproduction unit receives the analog audio signals from the audio signal source via the port adapter, and reproducing sounds corresponding to the analog audio signals. The second storage unit stores a default gain value and a gain index table; the gain index table lists genre types with a genre gain value of each of the genre types. The data transmission lines transmit the genre types and the genre gain values between the second storage unit and the audio signal source via the port adapter. The processing unit of the audio signal source further includes a genre reading module, a gain reading module, a gain adjusting module and a gain update module. The genre reading module reads a genre type of the selected audio file from a tag of the selected audio file. The gain reading module reads a genre gain value of the genre type from the gain index table. The gain adjusting module signals the gain amplifier to amplify the analog audio signals received from the digital-to-analog converter by the genre gain value. The gain update module updates the default gain value with the genre gain value.

Other apparatus, methods, features, and advantages will be or become apparent to one with skill in the art upon examination of the following drawings and detailed description. It is intended that all such additional apparatus, methods, features,

DETAILED DESCRIPTION OF THE INVENTION

The function of automatic gain control of the present invention can be applied in a car stereo apparatus or a portable electrical device such as an MP3 player, an electronic book, a mobile phone, and so on. The following detailed descriptions of preferred embodiments are made with reference to the attached drawings.

Figure 1:
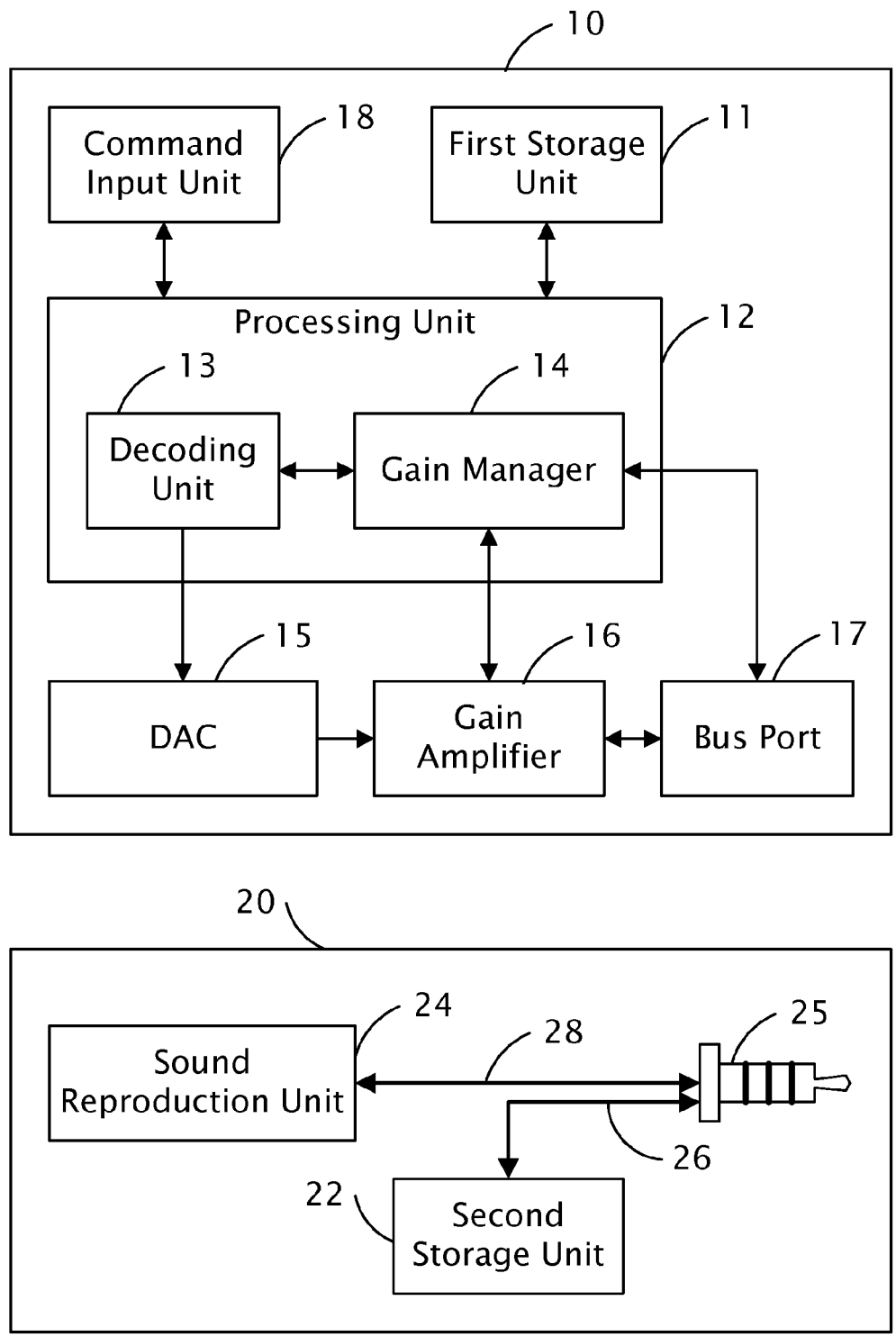
FIG. 1 is a block diagram of a hardware infrastructure of an audio processing apparatus in accordance with a preferred embodiment of the present invention.

FIG. 1 is a block diagram of a hardware infrastructure of the audio processing apparatus in accordance with a preferred embodiment of the present invention. The audio processing apparatus includes an audio signal source 10 and a sound reproduction device 20. The audio signal source 10 includes a first storage unit 11, a processing unit 12, a digital-to-analog converter (DAC) 15, a gain amplifier 16, a bus port 17, and a command input unit 18. The first storage unit 11 can be a nonvolatile memory, such as a flash memory or a hard disk. The processing unit 12 controls components of the audio signal source 10. The processing unit 12 may be a digital signal processor (DSP) or a central processing unit (CPU).

The command input unit 18 is used for receiving operational inputs and generating play command signals and gain adjust command signals correspondingly. The first storage unit 11 stores a plurality of audio files and a decoding program. The processing unit 12 includes a decoding unit 13 for invoking the decoding program after receiving the play command signal, fetching a selected audio file from the first storage unit, and decoding the selected audio file thereby generating digital audio signals of the audio file. The DAC 15 converts the digital audio signals to analog audio signals. The gain amplifier 16 amplifies the analog audio signals thereby yielding amplified analog audio signals, and sends the amplified analog audio signals to the sound reproduction device 20 via the bus port 17.

The sound reproduction device 20 includes a port adapter 25, signal transmission lines 28, and a sound reproduction unit 24. The port adapter 25 is configured for attaching to the bus port 17 and for transmitting data and command signals between the audio signal source 10 and the sound reproduction unit 24. The sound reproduction unit 24 receives the amplified analog audio signals from the audio signal source 10 via the port adapter 25 and the signal transmission lines 28, and reproduces sounds corresponding to the amplified analog audio signals.

The sound reproduction device 20 further includes a second storage unit 22 and data transmission lines 26. The second storage unit 22 can be a nonvolatile memory, such as a flash memory. The second storage unit 22 stores a default gain value and a gain index table. The gain index table lists genre types with a genre gain value of each of the genre types. The audio signal source 10 reads the genre types and the genre gain values from the second storage unit 22 via the port adapter 25 and the data transmission lines 26.

Figure 2:
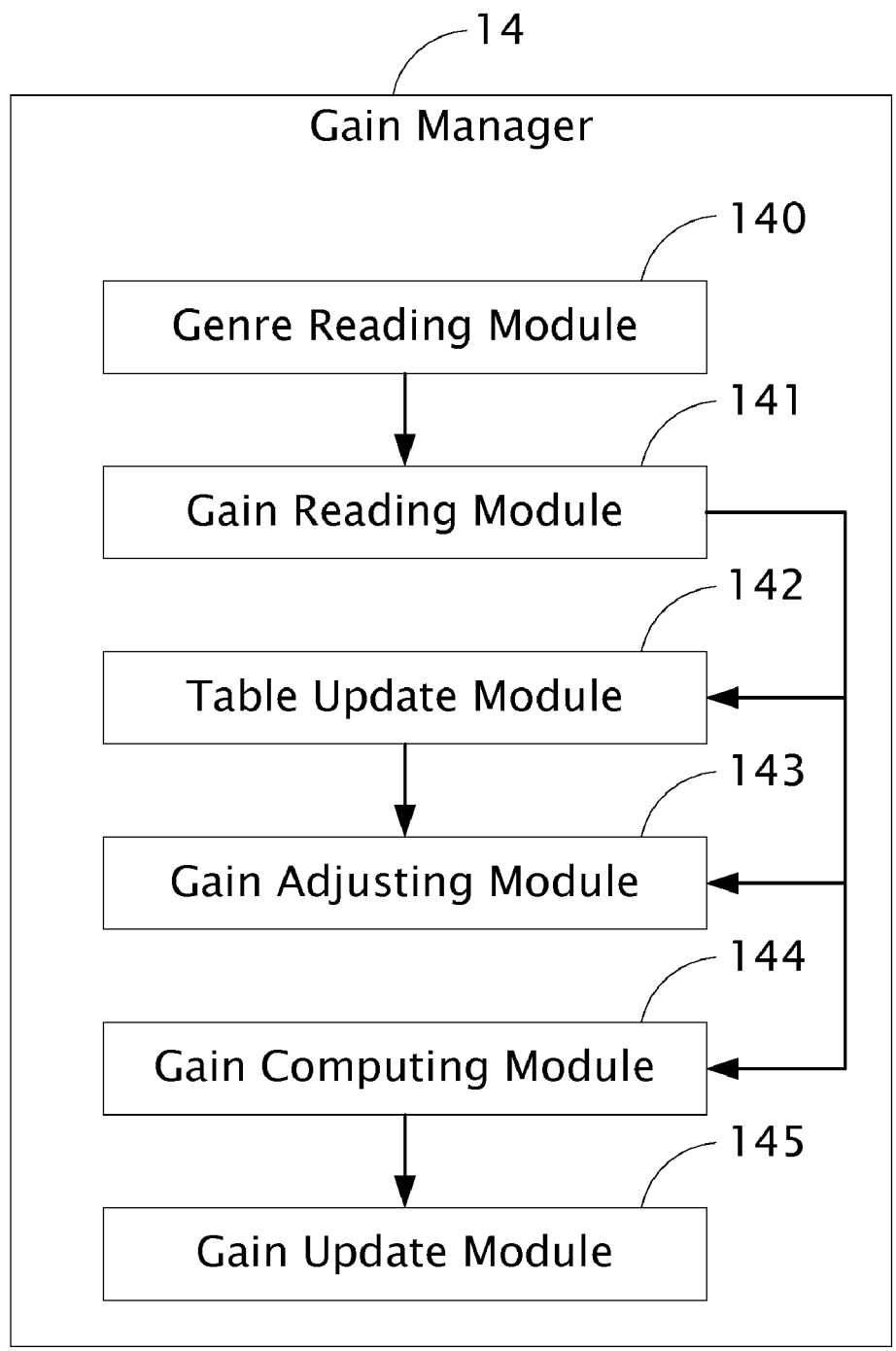
FIG. 2 is a schematic diagram of main function modules of a gain manager of FIG. 1.

The audio processing apparatus further includes a gain manager 14 that is integrated with the processing unit 12. Referring to FIG. 2, the gain manager 14 includes a genre reading module 140, a gain reading module 141, a gain adjusting module 143, and a gain update module 145.

The genre reading module 140 reads a genre type of the selected audio file from a tag of the selected audio file. The gain reading module 141 reads a genre gain value of the genre type from the gain index table stored in the second storage unit 22. The gain adjusting module 143 signals the gain amplifier 16 to amplify the analog audio signals received from the DAC 15 by the genre gain value. The gain update module 145 updates the default gain value stored in the second storage unit 22 with the genre gain value.

Referring to FIG. 2, the gain manager 14 further includes a table update module 142 and a gain computing module 144. If the gain reading module 141 detects that the gain index table does not list the genre type of the selected audio file, the table update module 142 inserts the genre type into the gain index table. Furthermore, if the gain reading module 141 detects that the gain index table does not list the genre gain value of the genre type, the gain reading module 141 reads the default gain value from the second storage unit 22, and the table update module 142 inserts the default gain value into the gain index table as a genre gain value of the genre type.

In response to the gain adjust command signal generated by the command input unit 18, the gain adjusting module 143 adjusts the default gain value to an adjusted gain value. Afterwards, the genre reading module 140 reads the genre type of the selected audio file while the selected audio file being played. The gain reading module 141 reads the genre gain value of the genre type from the gain index table.

The gain computing module 144 assigns a weight value respectively to the genre gain value and the adjusted gain value, multiplies the genre gain value and the adjusted gain value by the corresponding weight value, thereby obtaining two products, and sums the two products to obtain an integrated gain value. Finally, the gain update module 145 updates the genre gain value of the genre type with the integrated gain value.

Figure 3:
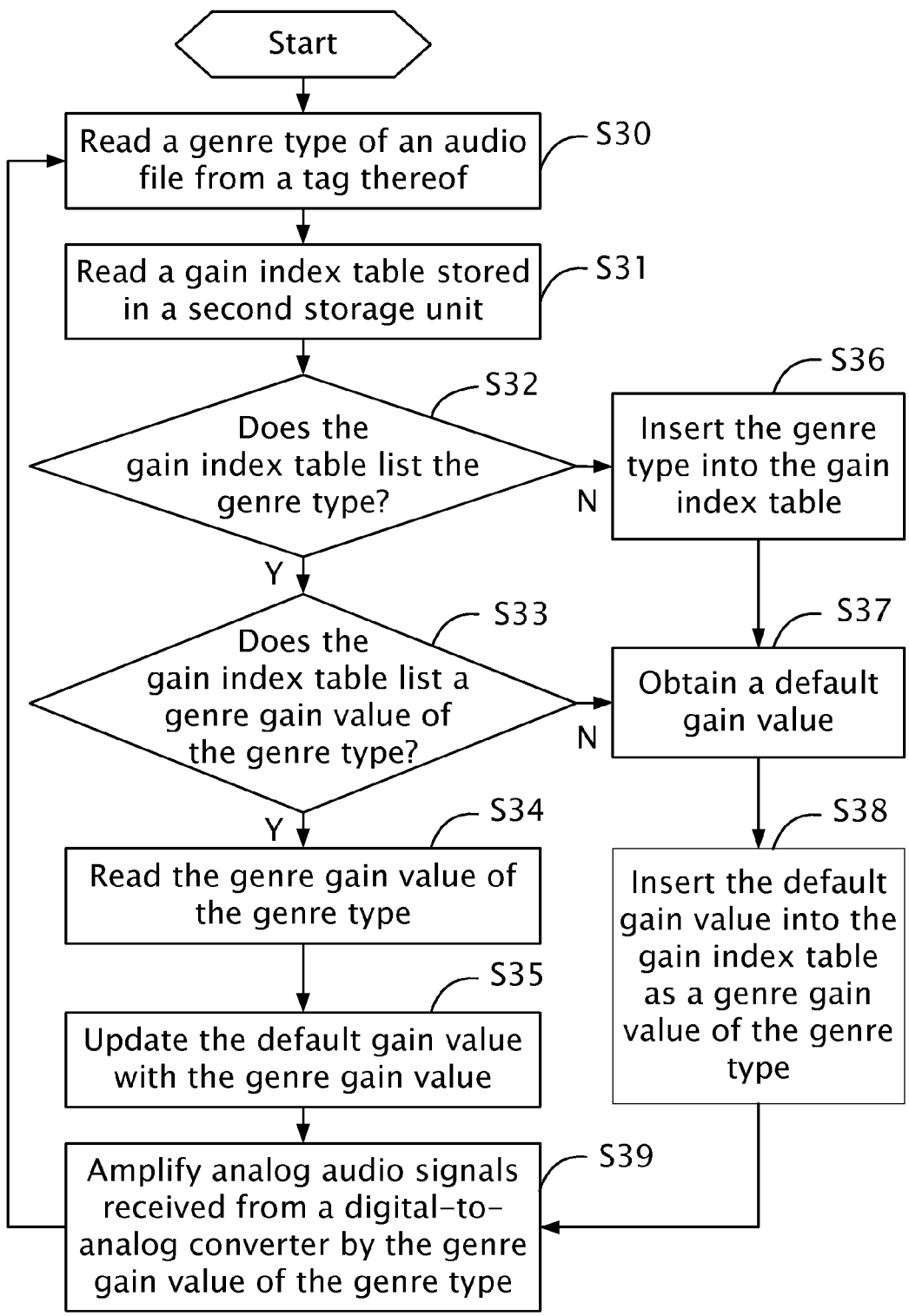
FIG. 3 is a flowchart of a preferred method for automatically controlling gain by utilizing the audio processing apparatus of FIG. 1.

FIG. 3 is a flowchart of a preferred automatic gain control method by utilizing the audio processing apparatus of FIG. 1. When the processing unit 12 reads the selected audio file from the first storage unit 11, in step S30, the genre reading module 140 reads the genre type of the selected audio file from the tag of the selected audio file.

In step S31, the gain reading module 141 reads the gain index table stored in the second storage unit 22, via the bus port 17. In step S32, the gain reading module 171 detects whether the gain index table lists the genre type of the selected audio file. If the gain index table does not list the genre type, in step S36, the table update module 172 inserts the genre type into the gain index table, and then the procedure goes to step S37.

In step S32, if the gain index table lists the genre type, in step S33, the gain reading module 171 detects whether the gain index table also lists the genre gain value of the genre type.

If the gain index table does not lists the genre gain value of the genre type, in step S37, the gain reading module 171 reads the default gain value from the second storage unit 22. In step S38, the table update module 172 inserts the default gain value into the gain index table as the genre gain value of the genre type, and then the procedure goes to step S35.

In step S33, if the gain index table lists the genre gain value of the genre type, in step S34, the gain reading module 171 reads the genre gain value of the genre type from the gain index table. In step S35, the gain adjusting module 173 signals the gain amplifier 16 to amplify the analog audio signals received from the DAC 15 by the genre gain value thereby yielding the amplified analog audio signals.

In step S39, the gain update module 175 updates the default gain value stored in the second storage unit 22 with the genre gain value of the genre type. Steps S30 to S39 is then performed recursively until the audio signal processing system 10 is turned-off.

Figure 4:
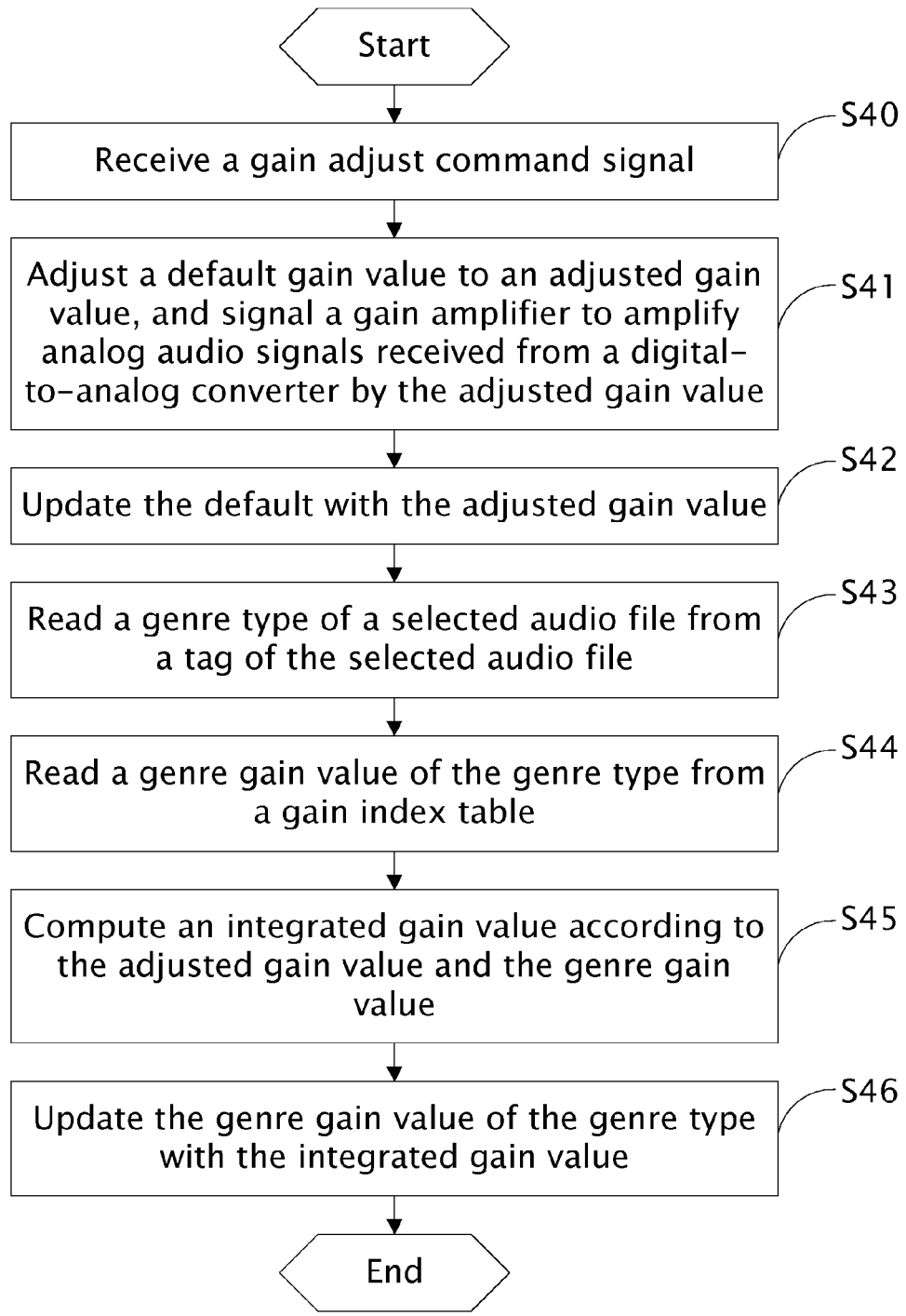
FIG. 4 is a flowchart of a preferred method of updating a genre gain value of a genre type by utilizing the audio processing apparatus of FIG. 1.

FIG. 4 is a flowchart of a preferred method of updating the genre gain value of the genre type by utilizing the audio processing apparatus of FIG. 1. In step S40, the gain manager 14 receives the gain adjust command signal from the command input unit 18.

In step S41, the gain adjusting module 143 adjusts the default gain value stored in the second storage unit 22 to the adjusted gain value, and signals the gain amplifier 16 to amplify the analog audio signals received from the DAC 15 by the adjusted gain value.

In step S42, the gain update module 145 updates the default gain value stored in the second storage unit 22 with the adjusted gain value.

In step S43, the genre reading module 140 reads the genre type of the selected audio file while the selected audio file being played from the tag of the selected audio file.

In step S44, the gain reading module 141 reads the genre gain value of the genre type from the gain index table.

In step S45, the gain computing module 144 assigns a weight value respectively to the genre gain value and the adjusted gain value, multiplies the genre gain value and the adjusted gain value by the corresponding assigned weight value, thereby obtaining the two products, and sums the two products to obtain the integrated gain value.

In step S46, the gain update module 175 updates the genre gain value of the genre type in the gain index table with the integrated gain value.

In an alternative embodiment, the gain update module 175 directly updates the genre gain value of the genre type in the gain index table with the adjusted gain value.

Figure 5:
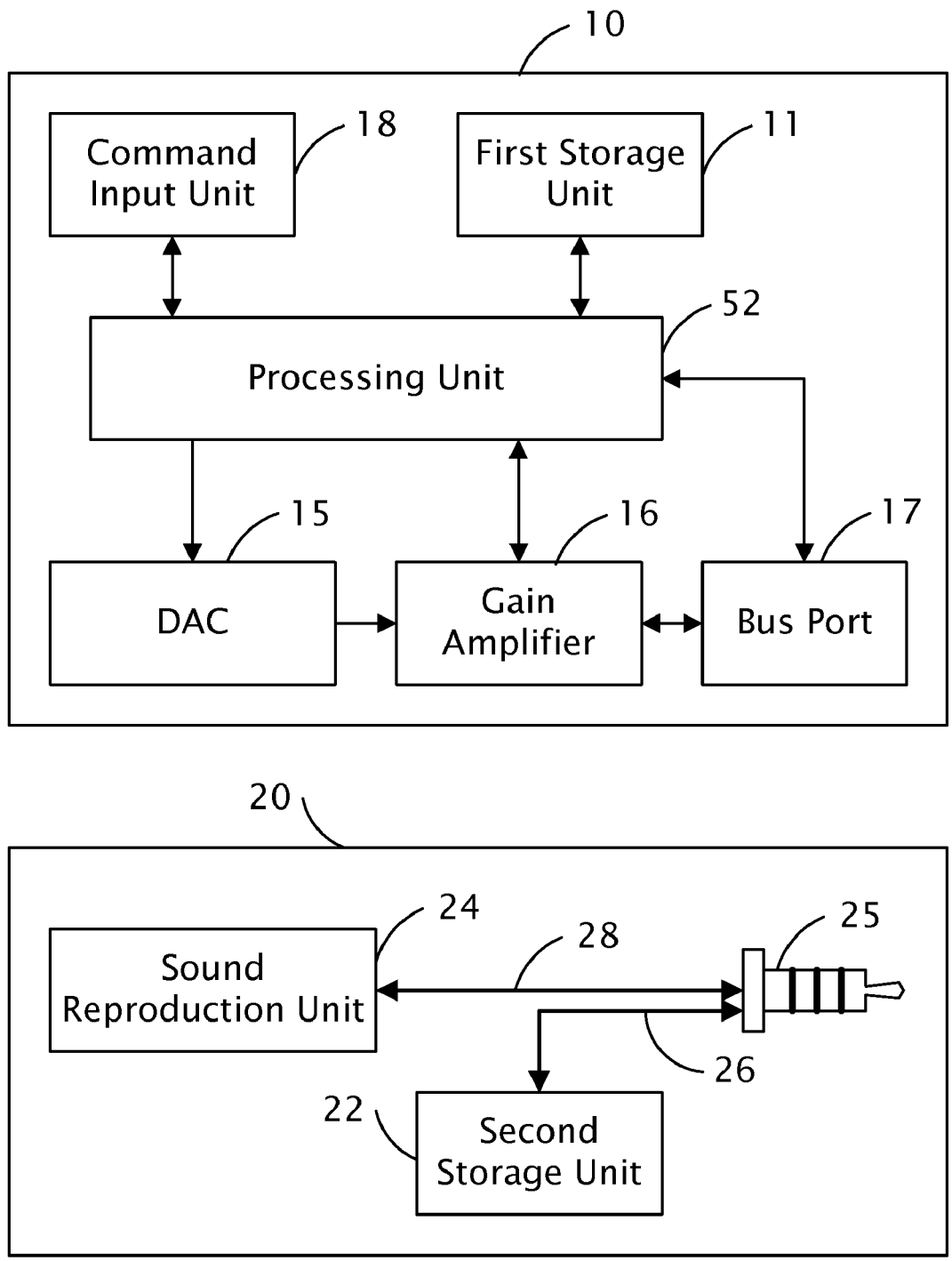
FIG. 5 is a block diagram of a hardware infrastructure of an audio processing apparatus in accordance with an alternative preferred embodiment of the present invention.

FIG. 5 is a block diagram of a hardware infrastructure of an audio processing apparatus in accordance with an alternative embodiment of the present invention. The audio processing apparatus of the alternative embodiment is the same as that of the preferred embodiment, except that the decoding unit 13 and the gain manager 14 are integrated into the processing unit 52 as modules of the processing unit 52.

Figure 6:
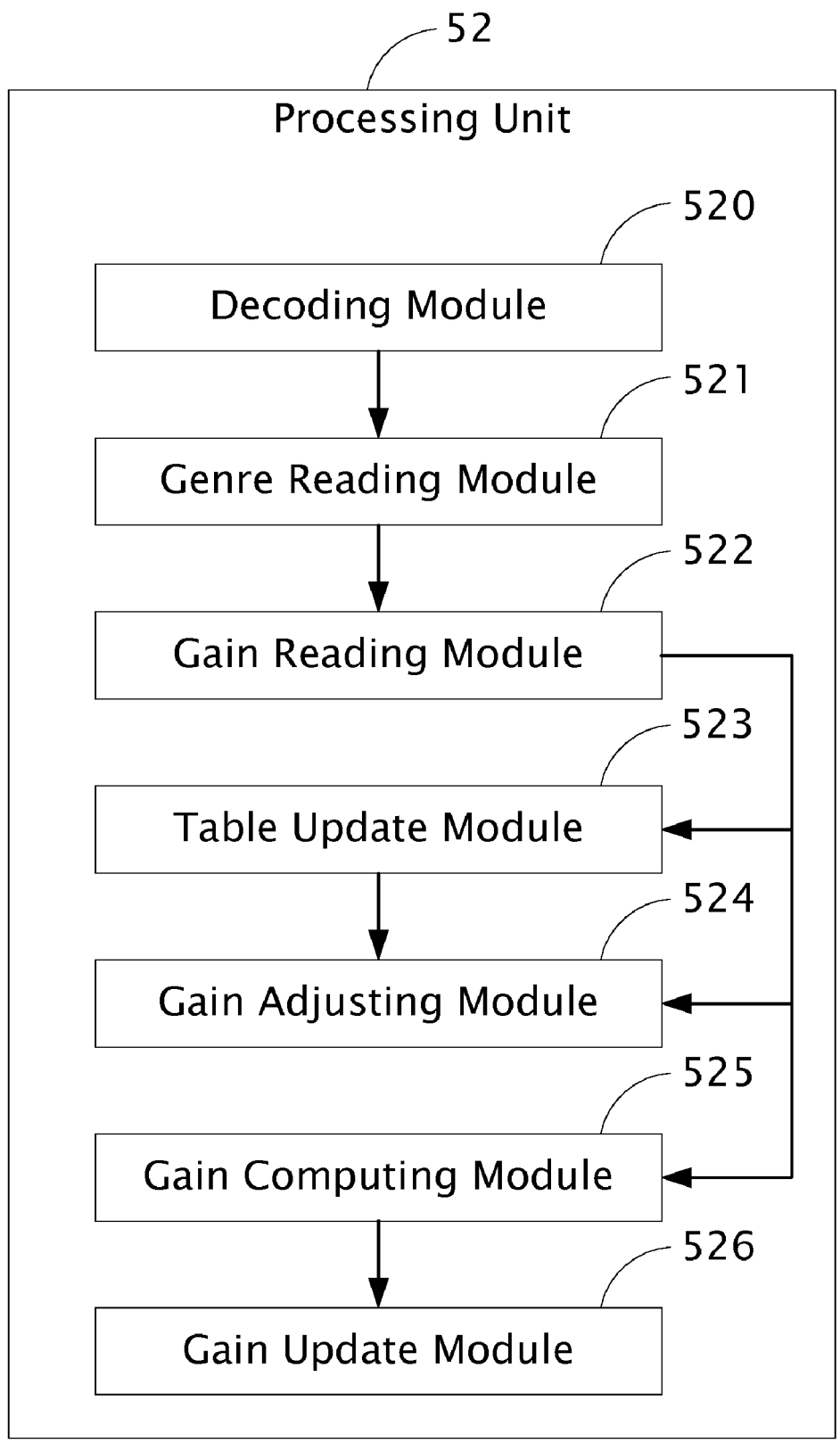
FIG. 6 is a schematic diagram of main function modules of a processing unit of FIG. 5.

Therefore, referring to FIG. 6, in the alternative embodiment, the processing unit 52 has the functions as well as the decoding unit 13 and the gain manager 14 do in FIG. 1. That is, the processing unit 52 has a decoding module 520 performing the same function as the decoding unit 13 in FIG. 1. The processing unit 52 further has a genre reading module 521, a gain reading module 522, a table update module 523, a gain adjusting module 524, a gain computing module 525 and a gain update module 526 respectively performing the same functions as the genre reading module 140, a gain reading module 141, a table update module 142, a gain adjustment 143, a gain computing module 144 and a gain update module 145 of the gain manager 14 in FIG. 1.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. An audio processing apparatus comprising an audio signal source and a sound reproduction device, wherein the audio signal source comprises:
   a bus port for attaching to the sound reproduction device;
   a command input unit for receiving operational inputs and generating command signals, the command signals comprising a play command signal;
   a first storage unit for storing a plurality of audio files and a decoding program; and
   a processing unit comprising:
   a decoding unit for invoking the decoding program after receiving the play command signal, fetching a selected audio file from the audio files, and decoding the selected audio file thereby generating digital audio signals;
   a digital/analog converter for converting the digital audio signals to analog audio signals; and
   a gain amplifier for amplifying the analog audio signals, and sending the analog audio signals to the sound reproduction device via the bus port; and
   the sound reproduction device comprises:
   a port adapter for attaching to the bus port;
   a sound reproduction unit for receiving the analog audio signals from the audio signal source via the port adapter, and reproducing sounds corresponding to the analog audio signals;
   a second storage unit for storing a default gain value and a gain index table, the gain index table listing genre types with a genre gain value of each of the genre types; and
   data transmission lines for transmitting the genre types and the genre gain values between the second storage unit and the audio signal source via the port adapter;
   wherein the processing unit of the audio signal source further comprises a gain manager for comprising:
   a genre reading module for reading a genre type of the selected audio file from a tag of the selected audio file;
   a gain reading module for reading a genre gain value of the genre type from the gain index table;
   a gain adjusting module for signaling the gain amplifier to amplify the analog audio signals received from the digital/analog converter by the genre gain value, wherein in response to a gain adjust command signal generated by the command input unit, the gain adjusting module adjusts the default gain value to an adjusted gain value, the genre reading module reads the genre type of the selected audio file while the selected audio file being played, and the gain reading module reads a genre gain value of the genre type from the gain index table;
   a gain computing module for computing an integrated gain value according to the genre gain value of the genre type and the adjusted gain value; and
   a gain update module for updating the default gain value with the genre gain value, and updating the genre gain value of the genre type with the integrated gain value.

2. The audio processing apparatus according to claim 1, wherein the processing unit further comprises a table update module for inserting the genre type into the gain index table, if the gain index table does not list the genre type.

3. The audio processing apparatus according to claim 1, wherein the processing unit further comprises a table update module for inserting the default gain value into the gain index table as a genre gain value of the genre type, if the gain index table does not list the genre gain value of the genre type.

4. The audio processing apparatus according to claim 1, wherein the gain computing module assigns a weight value respectively to the genre gain value and the adjusted gain value, multiplies the genre gain value and the adjusted gain value by the corresponding weight value, thereby obtaining two products, and sums the two products to obtain the integrated gain value.

5. The audio processing apparatus according to claim 1, wherein in response to a gain adjust command signal generated by the command input unit, the gain adjusting module adjusts the default gain value to an adjusted gain value, and the gain update module updates the genre gain value of the genre type with the adjusted gain value.

6. An audio processing apparatus comprising an audio signal source and a sound reproduction device, wherein the audio signal source comprises:
- a bus port for attaching to the sound reproduction device;
- a command input unit for receiving operational inputs and generating command signals, the command signals comprising a play command signal;
- a first storage unit for storing a plurality of audio files and a decoding program; and
- a processing unit comprising:
- a decoding module for invoking the decoding program after receiving the play command signal, fetching a selected audio file from the audio files, and decoding the selected audio file thereby generating digital audio signals;
- a digital/analog converter for converting the digital audio signals to analog audio signals; and
- a gain amplifier for amplifying the analog audio signals, and sending the analog audio signals to the sound reproduction device via the bus port; and the sound reproduction device comprising:
- a port adapter attaching to the bus port;
- a sound reproduction unit for receiving the analog audio signals from the audio signal source via the port adapter, and reproducing sounds corresponding to the analog audio signals;
- a second storage unit for storing a default gain value and a gain index table, the gain index table listing genre types with a genre gain value of each of the genre types; and
- data transmission lines for transmitting the genre types and the genre gain values between the second storage unit and the audio signal source;

wherein the processing unit of the audio signal source further comprises:
- a genre reading module for reading a genre type of the selected audio file from a tag of the selected audio file;
- a gain reading module for reading a genre gain value of the genre type from the gain index table;
- a gain adjusting module for signaling the gain amplifier to amplify the analog audio signals received from the digital/analog converter by the genre gain value, wherein in response to a gain adjust command signal generated by the command input unit, the gain adjusting module adjusts the default gain value to an adjusted gain value, the genre reading module reads the genre type of the selected audio file while the selected audio file being played, and the gain reading module reads a genre gain value of the genre type from the gain index table;
- a gain computing module for computing an integrated gain value according to the genre gain value of the genre type and the adjusted gain value; and
- a gain update module for updating the default gain value with the genre gain value, and updating the genre gain value of the genre type with the integrated gain value.

7. The audio processing apparatus according to claim 6, wherein the processing unit further comprises a table update module for inserting the genre type into the gain index table, if the gain index table does not list the genre type.

8. The audio processing apparatus according to claim 6, wherein the processing unit further comprises a table update module for inserting the default gain value into the gain index table as a genre gain value of the genre type, if the gain index table does not list the genre gain value of the genre type.

9. The audio processing apparatus according to claim 6, wherein the gain computing module assigns a weight value respectively to the genre gain value and the adjusted gain value, multiplies the genre gain value and the adjusted gain value by the corresponding weight value, thereby obtaining two products, and sums the two products to obtain the integrated gain value.

10. The audio processing apparatus according to claim 6, wherein in response to a gain adjust command signal generated by the command input unit, the gain adjusting module adjusts the default gain value to an adjusted gain value, and the gain update module updates the genre gain value of the genre type with the adjusted gain value.

* * * * *